(12) United States Patent
Webb et al.

(10) Patent No.: US 7,442,267 B1
(45) Date of Patent: *Oct. 28, 2008

(54) ANNEAL OF RUTHENIUM SEED LAYER TO IMPROVE COPPER PLATING

(75) Inventors: Eric G. Webb, Salem, OR (US); Jonathan D. Reid, Sherwood, OR (US); Seyang Park, Beaverton, OR (US); Johanes H. Sukamto, Lake Oswego, OR (US)

(73) Assignee: Novellus Systems, Inc., San Jose, CA (US)

( * ) Notice: Subject to any disclaimer, the term of this patent is extended or adjusted under 35 U.S.C. 154(b) by 535 days.

This patent is subject to a terminal disclaimer.

(21) Appl. No.: 10/999,838

(22) Filed: Nov. 29, 2004

(51) Int. Cl.
*C22F 1/14* (2006.01)
(52) U.S. Cl. .................... 148/518; 148/678
(58) Field of Classification Search ........... 148/578, 148/678
See application file for complete search history.

(56) References Cited

U.S. PATENT DOCUMENTS

| | | | |
|---|---|---|---|
| 5,372,849 A | 12/1994 | McCormick et al. | |
| 6,074,945 A | 6/2000 | Vaartstra | |
| 6,284,652 B1 | 9/2001 | Charneski | |
| 6,413,864 B1 | 7/2002 | Pyo | |
| 6,468,907 B2 | 10/2002 | Pyo | |
| 6,534,357 B1* | 3/2003 | Basceri et al. | 438/239 |
| 6,593,236 B2 | 7/2003 | Pyo | |
| 6,605,549 B2 | 8/2003 | Leu | |
| 6,605,735 B2 | 8/2003 | Kawano | |
| 6,613,695 B2 | 9/2003 | Pomarede | |
| 6,638,859 B2 | 10/2003 | Sneh | |
| 6,664,184 B2* | 12/2003 | Nakahara et al. | 438/650 |
| 7,285,308 B2* | 10/2007 | Hendrix et al. | 427/248.1 |
| 2002/0102826 A1* | 8/2002 | Shimamoto et al. | 438/575 |
| 2004/0105934 A1* | 6/2004 | Chang et al. | 427/255.28 |
| 2005/0274621 A1* | 12/2005 | Sun et al. | 205/209 |

OTHER PUBLICATIONS

Kwon, Oh-Kyum et al., "Enhancement of Iodine Adsorption Using I2 Plasma for Seedless Catalyst-Enhanced CVD of Copper", Electrochemical and Solid-State Letters, vol. 6, No. 8, pp. C109-C111 (2003), The Electrochemical Society, Inc.

* cited by examiner

Primary Examiner—George Wyszomierski
(74) Attorney, Agent, or Firm—Thomas Swenson

(57) ABSTRACT

A ruthenium-containing thin film is formed. Typically, the ruthenium-containing thin film has a thickness in a range of about from 1 nm to 20 nm. The ruthenium-containing thin film is annealed in an oxygen-free atmosphere, for example, in $N_2$ forming gas, at a temperature in a range of about from 100° C. to 500° C. for a total time duration of about from 10 seconds to 1000 seconds. Thereafter, copper or other metal is deposited by electroplating or electroless plating onto the annealed ruthenium-containing thin film. In some embodiments, the ruthenium-containing thin film is also treated by UV radiation.

43 Claims, 4 Drawing Sheets

ANNEAL OF RUTHENIUM SEED LAYER TO IMPROVE COPPER PLATING

FIELD OF THE INVENTION

The invention is related to the field of metal plating in integrated circuit fabrication, in particular to methods for treating a ruthenium seed layer to promote plating of copper and other metals.

BACKGROUND OF THE INVENTION

Deposition of copper wiring in integrated circuits involves a number of processes. Typically, a trench or hole is etched into dielectric material located on a substrate wafer. Then, the hole or trench typically is lined with one or several adhesion and diffusion-barrier layers; for example, with tantalum nitride, TaN. The hole or trench then is lined with a thin layer of copper, Cu, that acts as a seed layer for electroplated copper. Thereafter, the hole or trench is filled with copper, typically by an electroplating process.

While copper is useful as a seed layer for the plating of copper, it has the disadvantage that a diffusion barrier layer is required to prevent diffusion of copper into other parts of the integrated circuit. One of the major challenges in the field of copper-based interconnects in semiconductor manufacturing is the identification and deposition of a material that could not only serve as a diffusion barrier to copper migration into adjoining dielectric layers, but would also serve as a seed layer for direct copper plating. Preferably, a material suitable for use as both a diffusion barrier and a seed layer would adhere well to dielectric materials used in integrated circuits.

A thin film of ruthenium metal deposited on a wafer substrate is useful as a diffusion barrier layer to inhibit or to prevent diffusion of copper into adjoining dielectric layers. In the past, the formation of ruthenium on dielectric material has been problematic. The deposition of a metal thin film, particularly of ruthenium, Ru, or other Ru-containing layer, by chemical vapor deposition (such as CVD and ALD) directly onto a dielectric material often resulted in poor morphology of the thin film. The plating of copper directly onto a ruthenium seed layer has also been problematic in the past. Copper that is plated directly onto a conventional ruthenium-containing layer often shows poor adhesion to the ruthenium-containing layer. Also, the relatively high resistivity of a conventional ruthenium-containing layer, compared to a conventional copper seed layer, typically increases the undesired terminal effect during copper plating. As a result, electroplated copper deposits unevenly on the wafer substrate and electrofilling of high aspect ratio features is unsatisfactory. Undesired void spaces in metal-filled features are common.

In the past, adhesion layers, barrier layers and copper seed layers lining holes and trenches were deposited using conventional physical vapor deposition techniques. As the design density of integrated circuits increases, resulting in smaller dimensions of holes and trenches, it is generally more difficult to use physical vapor deposition to line holes and trenches with uniform and conformal thin films of integrated circuit material. As a result, deposition of metal, particularly ruthenium metal and other ruthenium-containing compounds, by chemical vapor deposition (CVD) and atomic layer deposition (ALD) is important for achieving good circuit quality and acceptable manufacturing yields.

Chemical vapor deposition of metal directly onto a dielectric material, such as silicon oxide, $SiO_2$, or onto standard adhesion layer material, such as tantalum nitride, TaN, is often accompanied by delayed and discontinuous growth, surface roughness and poor adhesion. These problems are especially acute in processes for depositing ruthenium on silicon oxide ($SiO_2$). Many other metal CVD processes, for example, MOCVD of copper, suffer these problems also.

Co-owned and co-pending U.S. patent application Ser. No. 10/821,751, which is hereby incorporated by reference, teaches a plasma treatment of an integrated circuit substrate that improves ruthenium metal deposition by CVD or ALD, particularly onto dielectric material. The plasma treatment reduces the time required for nucleation of ruthenium metal on the substrate surface during a chemical vapor deposition process, thereby decreasing the nucleation delay of metal growth on the substrate surface. Improved nucleation of metal improves surface morphology of deposited metal, allowing thinner films to be continuous. Further, plasma treatment generally decreases the deposition rate of metal onto the plasma-treated surface, thereby improving control of the growth and thickness of metal films, especially ultra-thin films such as seed layers. It is believed that plasma treatment of a surface with excited species (e.g., excited iodine species) suppresses the subsequent deposition rate of ruthenium or other metal on the treated surface, resulting in less "island" growth and more uniform layer growth. Plasma treatment of a substrate surface improves adhesion of deposited metal to the substrate surface. Improved morphology and greater smoothness of deposited metal improves adhesion of materials subsequently formed in contact with the metal. As a result, overall film-stack adhesion is enhanced.

There exists a need for making a conductive layer that can serve as an adhesion layer and a barrier layer and also as a seed layer for electroplating of copper or other plating metal.

SUMMARY OF THE INVENTION

The invention helps to solve some of the problems mentioned above by providing systems and methods for depositing and for treating a ruthenium-containing thin film on an integrated circuit substrate to improve plating of copper and other metals onto the ruthenium-containing thin film.

A method of treating a ruthenium-containing thin film in accordance with the invention comprises processes of annealing the ruthenium-containing thin film in an oxygen-free environment. When a ruthenium-containing thin film serves as a barrier or seed layer, the processes of annealing are conducted before depositing metal on the annealed ruthenium-containing thin film.

Some embodiments comprise processes of applying UV radiation to the annealed ruthenium-containing thin film before depositing metal on the annealed ruthenium-containing thin film. Other embodiments comprise processes of applying UV radiation to the ruthenium-containing thin film before the processes of annealing. Still other embodiments comprise processes of applying UV radiation to the ruthenium-containing thin film during the processes of annealing.

Typically, the ruthenium-containing thin film comprises metal atoms that are substantially ruthenium atoms. In other embodiments, the ruthenium-containing thin film comprises metal atoms that are ruthenium and one or more other types of metal atoms that form ruthenium alloys, such as cobalt, nickel and tantalum.

Generally, a ruthenium-containing thin film annealed in accordance with the invention has a thickness in a range of about from 1 nm to 50 nm. Typically, the ruthenium-containing thin film has a thickness in a range of about from 1 nm to 20 nm.

The processes of annealing the ruthenium-containing thin film comprise generating oxide-reducing conditions. Generally, processes of annealing the ruthenium-containing thin film comprise annealing the ruthenium-containing thin film in an oxygen-free environment at a temperature in a range of about from 100° C. to 500° C. Typically, the processes of annealing are conducted in forming gas.

Some embodiments further comprise processes of moving the ruthenium-containing thin film located on the substrate into an anneal chamber before the processes of annealing. Some embodiments further comprise processes of removing gas from the anneal chamber before the processes of annealing to form the oxygen-free environment. In some embodiments, processes of removing gas from the anneal chamber comprise flowing an oxygen-free gas through the anneal chamber. Typically, flowing an oxygen-free gas comprises flowing nitrogen gas.

Some embodiments comprise forming a ruthenium-containing thin film on a wafer substrate.

Embodiments in accordance with the invention are particularly suitable for annealing a ruthenium-containing thin-film used as a diffusion-barrier/seed layer prior to the plating of copper or other metal used as a conductive interconnect in integrated circuits. A method of plating metal, particularly copper, in accordance with the invention comprises processes of providing a ruthenium-containing thin film on a substrate; annealing the ruthenium-containing thin film in an oxygen-free environment to form an annealed ruthenium-containing thin film; and plating copper directly onto the annealed ruthenium-containing thin film.

Generally, the processes of annealing are conducted less than 24 hours before the processes of plating copper, typically less than 3 hours before the processes of plating copper. Preferably, the processes of annealing are conducted less than 1 hour before the processes of plating copper, and more preferably, the processes of annealing are conducted less than 5 minutes before the processes of plating copper. Some embodiments in accordance with the invention further comprise processes of storing the annealed ruthenium-containing thin film in an oxygen-free space before the processes of plating copper. Preferably, the exposure time to air or other oxidizing conditions of an annealed ruthenium thin-film before metal deposition does not exceed one hour; more preferably, it does not exceed five minutes.

Generally, the processes of plating copper comprise electroplating copper. In some embodiments, the processes of plating copper comprise electroless plating of copper.

It is believed that annealing in an oxygen-free atmosphere reduces oxides and thereby reduces resistivity in a ruthenium-containing thin film. The reduced resistivity decreases the terminal effect during electroplating. In contrast, annealing of copper seed layers in the prior art caused agglomeration of the copper, resulting in uneven and discontinuous copper seed layers and an increase in resistivity.

Annealing of a ruthenium-containing thin film in accordance with the invention improves the adhesion of copper or other metal electroplated onto the annealed ruthenium-containing film. Annealing of a ruthenium-containing thin film in accordance with the invention also improves the filling of features in integrated circuit substrates during subsequent metal plating processes. In particular, annealing of a ruthenium-containing thin film in accordance with the invention helps avoid formation of undesirable void spaces during metal-filling of high-aspect-ratio features, such as vias.

Other features, characteristics and advantages of embodiments in accordance with the invention will become apparent in the detailed description below.

BRIEF DESCRIPTION OF THE DRAWINGS

A more complete understanding of the invention may be obtained by reference to the drawings, in which.

DESCRIPTION OF THE INVENTION

Figure 1:
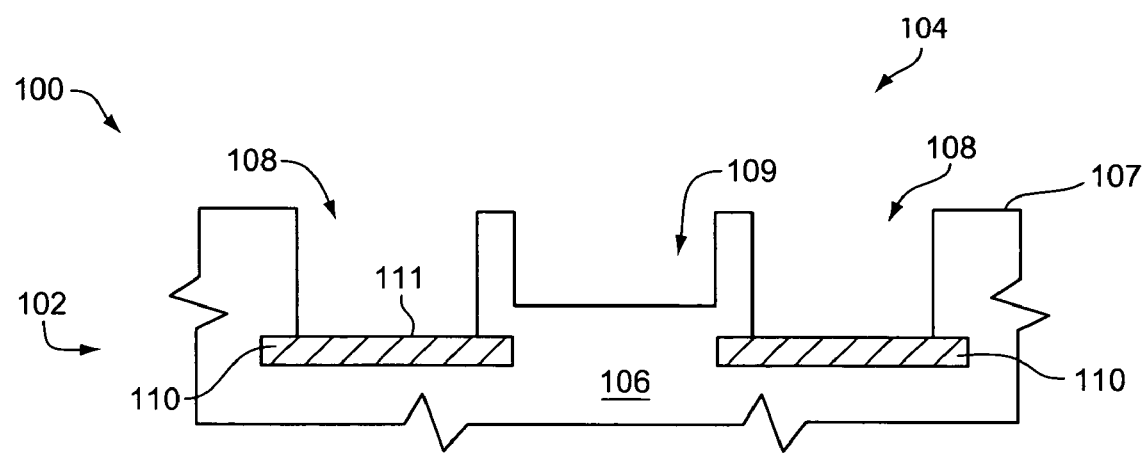
FIG. 1 depicts schematically a cross-sectional view of a portion of an exemplary integrated circuit having etched features in a dielectric layer.

The invention is described herein with reference to FIGS. 1-8. It should be understood that the FIGS. 1-5, depicting integrated circuit devices, are not meant to be actual plan or cross-sectional views of any particular portion of an actual integrated circuit device. In the actual devices, the layers will not be as regular and the thicknesses may have different proportions. The various layers in actual devices often are curved and possess overlapping edges. The figures instead show idealized representations, which are employed to explain more clearly and fully the method of the invention than would otherwise be possible. Also, the figures represent only one of innumerable variations of devices that could be fabricated using the method of the invention. Processes are described in the specification with reference to FIGS. 1-8; nevertheless, it is clear that methods in accordance with the invention can be practiced using structures, apparati and fabrication processes very different from those described in detail herein. The preferred embodiments described herein are exemplary and are not intended to limit the scope of the invention, which is defined in the claims below.

Terms such as "heating", "drying", "baking", "rapid thermal process" ("RTP"), "furnace anneal", and others all involve the application of heat. The various terms are used in the art for the sake of clarity, to distinguish certain techniques and method steps from one another. In this specification, the term "anneal" refers to heating of a substrate wafer and a ruthenium-containing thin film located on the wafer in an oxygen-free atmosphere. It is clear that annealing processes in accordance with the invention can be designated by other terms of art, such as "heating" or "baking". An anneal in accordance with the invention conducted using a rapid thermal processing, RTP, technique is distinct from other heating techniques in being characterized by a very rapid rise in ambient temperature and in the temperature of the heated object, typically at an actual ramp rate of 10° C. to 200° C. per second. It is further understood that one skilled in the art may accomplish a desired process result using an annealing technique as disclosed herein, while referring to the technique with a term different from the one used herein.

The term "oxygen-free environment", "oxygen-free atmosphere", and similar terms in this specification refer to any substantially oxygen-free environment that promotes reduction of ruthenium oxides and other oxides present in a ruthenium-containing thin film upon heating in accordance with the invention.

The term "oxygen-free storage space" and "oxygen-free space" in this specification refer to a substantially oxygen-free space in which oxidation of ruthenium and other metals in a ruthenium-containing thin-film is substantially inhibited.

The terms "space", "region", and "area" as used herein generally have their usual meaning; that is, "area" generally designates a two-dimensional surface, whereas a "space" or a "region" is generally three-dimensional. For example, the term "feature space" typically refers to an etched-out space in a circuit layer.

The terms "then", "after", "thereafter" and similar terms are used interchangeably in specification to indicate that a particular process or set of processes is conducted sometime after a previous process. These terms do not necessarily signify immediately thereafter.

The term "Ru-containing" refers generally to a chemical species containing one or more ruthenium atoms. The term "Ru-containing", therefore, refers to pure ruthenium metal, as well as to compounds and species that contain ruthenium together with other chemical elements. The terms "Ru", "ruthenium", "Ru-containing", and similar terms are often used synonymously. For example, the terms "ruthenium precursor", "Ru-containing precursor", and similar terms are used synonymously to mean a precursor compound containing ruthenium atoms that is used in a CVD process to deposit a Ru-containing thin film. As another example, a ruthenium-containing thin film before treating in accordance with the invention may comprise pure ruthenium metal, a ruthenium oxide, or another ruthenium-containing compound, depending on the context. After treating a ruthenium-containing thin film by annealing in accordance with the invention, ruthenium oxide and other oxides that may have been present before annealing are substantially removed, usually through the reducing action of forming gas. Therefore, the terms "annealed thin film" and "treated thin-film" in this specification refer to a ruthenium-containing thin-film that is substantially oxide-free. In preferred embodiments, an annealed ruthenium-containing thin film comprises substantially pure ruthenium metal.

The terms "copper", "copper-containing" and similar terms are used synonymously in this specification to refer to copper-containing conductive interconnect materials known in the art that comprise either substantially copper or copper and other metals.

The term "CVD" and related terms are used broadly in the specification to refer to any chemical deposition methods, apparati, and structures related to a reaction involving one or more gaseous chemical reactants that forms a thin film on a solid substrate surface. As used in its broad sense, therefore, the term "CVD" and related terms also include references to ALD-CVD (or simply ALD) methods, apparati, and structures. The term "CVD" is also used in the specification in a narrower sense to refer to methods, apparati, and structures related to the reaction of one or more gaseous chemical reactants that forms a thin film having a thickness substantially greater than an atomic monolayer formed in an ALD cycle. The meanings of the term "CVD" and related terms are clear from the context in which the terms are used. CVD techniques for depositing thin films of ruthenium, ruthenium oxide and other metal-containing and non-metal-containing species typically utilize a hot-substrate hot-wall reactor apparatus to avoid condensation of reactant precursors prior to their decomposition at the substrate surface. Nevertheless, various suitable reaction apparati also include cold-wall/hot-substrate reactors, radiation beam reactors, and plasma- and photo-assisted CVD reactors, including ALD apparati.

Techniques for depositing ruthenium metal by CVD and ALD have been developed for forming thin films on a surface of a semiconductor substrate or substrate assembly, such as a silicon wafer. For example, U.S. Pat. No. 6,074,945, issued Jun. 13, 2000, to Vaartstra et al., U.S. Pat. No. 5,372,849, issued Dec. 13, 1994, to McCormick et al., and U.S. Patent Application Publication No. U.S. 2003/0037802 A1, published Feb. 27, 2003, naming Nakahara et al., which are hereby incorporated by reference, disclose methods and precursors for CVD deposition of ruthenium on integrated circuit substrates.

The term "thin film" and related terms herein generally refer to layers or films of integrated circuit material having a thickness not exceeding 1 µm, generally not exceeding 500 nm, and typically about 200 nm or less. When used to refer to a ruthenium-containing thin film, the term thin film typically means a ruthenium thin-film having a thickness not exceeding 50 nm, usually having a thickness in a range of about from 1 nm to 20 nm, which corresponds to the thickness range of a ruthenium seed layer.

FIG. 1 depicts schematically a cross-sectional view 100 of a portion 102 of an integrated circuit 104 in an intermediate phase of fabrication. Portion 102 includes a dielectric layer 106 having a surface 107. Dielectric layer 106 typically comprises a silicon-containing dielectric material, such as, but not limited to, $SiO_2$, BPSG, carbon-doped silicon oxide (e.g., CORAL™), nitrogen-doped silicon oxide, SiN, carbon-doped silicon nitride, SiC, and nitrogen-doped silicon carbide. A dielectric layer 106 also may include non-silicon-containing low-k dielectric material instead of or in addition to silicon-containing dielectric material; for example, a commercially-available polymer-based carbon-hydrogen-oxygen-containing dielectric material, such as SILK™. Integrated circuit portion 102 includes empty spaces, or regions, 108, 109, typically etched features, located in dielectric layer 106. Empty spaces 108,109 typically serve as vias or trenches to accommodate interlevel electrical connections, wiring and other electrically-conductive metal-containing circuit structures. Integrated circuit 104 also includes circuit elements 110, having exposed surfaces 111, located at the bottom of features 108. Circuit elements 110 are one or several of various elements used in integrated circuits; for example, passive conductive elements, such as conductive wiring, and active elements, such as a capacitor and a transistor.

Figure 2:
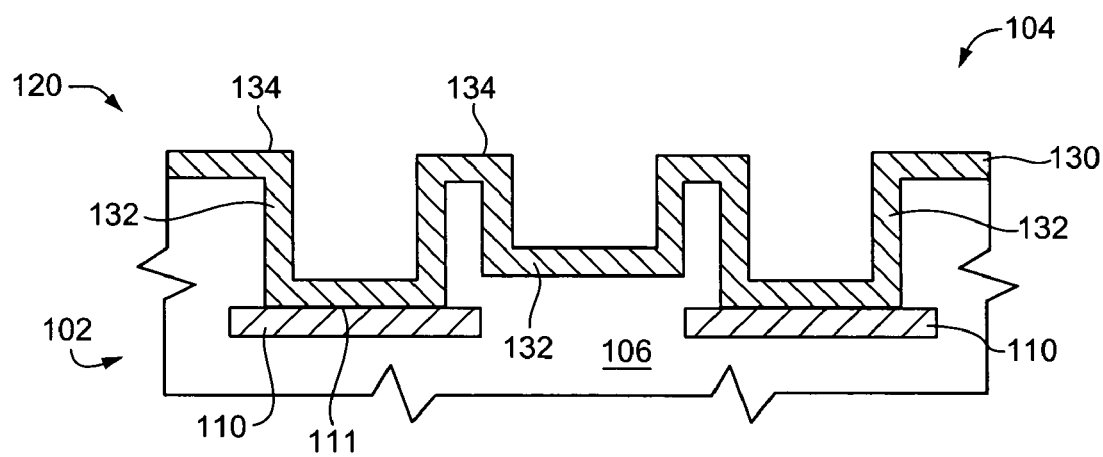
FIG. 2 depicts schematically the section of FIG. 1 in a further intermediate phase of fabrication in which a ruthenium-containing diffusion-barrier/seed layer has been deposited on the dielectric substrate.

FIG. 2 depicts schematically sectional view 120 of portion 102 in a further intermediate phase of fabrication in which a ruthenium-containing diffusion-barrier/seed layer 130 has been formed on surface 107 of dielectric layer 106 and on surfaces 111 of circuit elements 110, preferably by using a MOCVD method to deposit the ruthenium. Ruthenium-containing thin film 130 typically has a thickness in a range of about from 1 nm to 20 nm. Diffusion-barrier/seed layer 130 includes lower portions 132, covering the inside surfaces in feature spaces 108, 109, and an upper portion 134, covering the upper surfaces of dielectric layer 106. A ruthenium-containing thin film in accordance with the invention typically comprises metal atoms that are substantially only ruthenium. In some embodiments, a ruthenium-containing thin film comprises other metal atoms in addition to ruthenium atoms. For example, ruthenium alloys containing one or more of cobalt, nickel, tantalum and other metals are suitable.

Figure 3:
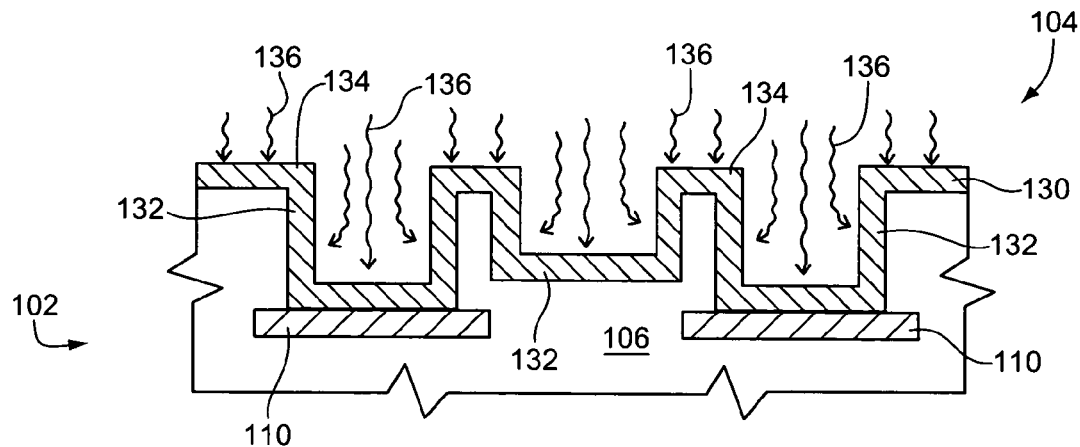
FIG. 3 depicts schematically the section of FIG. 2 in a further intermediate phase of fabrication in which annealing treatment of the ruthenium-containing diffusion-barrier/seed layer is being conducted in accordance with the invention by heating in an oxygen-free environment.
Figure 4:
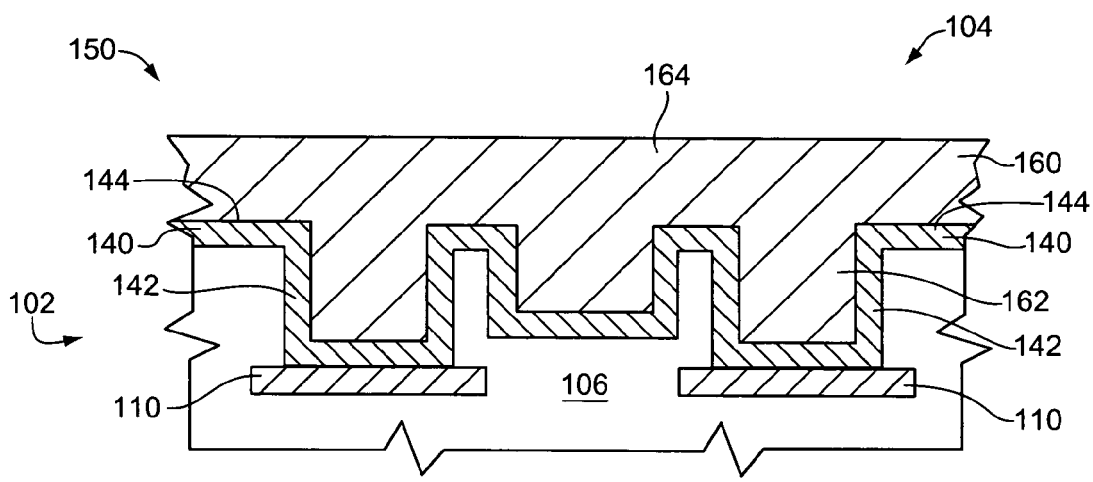
FIG. 4 depicts schematically the section of FIG. 3 in a later phase of fabrication in which a second, copper-containing metal layer has been deposited on the annealed ruthenium-containing diffusion-barrier/seed layer to fill the etched features.

FIG. 3 depicts the section of FIG. 2 in a still further intermediate phase of fabrication in which annealing treatment of ruthenium-containing diffusion-barrier/seed layer 130 is being conducted in accordance with the invention by heating in an oxygen-free environment. Arrows 136 represent annealing treatment in accordance with the invention of ruthenium-containing diffusion-barrier/seed layer 130. The reduction of oxides in ruthenium-containing thin film 130 through annealing forms an annealed ruthenium-containing seed layer 140 having annealed lower portion 142 and annealed upper portion 144, as shown in FIG. 4. Some embodiments include additional treating of ruthenium-containing diffusion-barrier/seed layer 130 or annealed ruthenium-containing diffusion-barrier/seed layer 140 with UV radiation. If a ruthenium-containing thin film containing one or more other metals in addition to ruthenium serves as a diffusion-barrier/seed layer, it is important that diffusion-barrier properties are sufficient and that the annealed ruthenium-containing seed layer minimizes agglomeration of metal plated on the seed layer.

FIG. 4 depicts schematically sectional view 150 of portion 102 in a later phase of fabrication in which a second, copper-containing metal layer 160 has been deposited on annealed ruthenium-containing seed layer 140. In preferred embodiments, metal layer 160, typically comprising copper or another metal instead of or in addition to copper, is deposited using a plating technique. As depicted in FIG. 4, metal layer 160 comprises lower portions 162 that fill feature spaces 108, 109 and an upper portion 164 located on the upper portions 144 of ruthenium seed layer 140.

Figure 5:
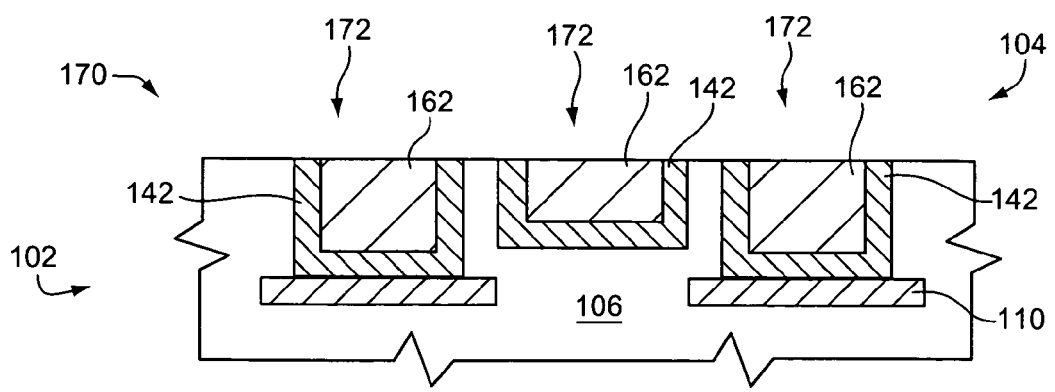
FIG. 5 depicts schematically the section of FIG. 4 in a still later phase of fabrication in which the upper portion of the copper-containing metal layer and the upper portion of the annealed diffusion-barrier/seed layer have been removed, thereby forming conductive interconnects in the copper-filled features.

FIG. 5 depicts schematically sectional view 170 of portion 102 in a still later phase of fabrication in which upper portion 164 of copper-containing metal layer 160 and upper portion 144 of annealed diffusion-barrier/seed layer 140 have been removed, typically by a conventional chemical metal polishing (CMP) technique. The several remaining portions 142 of ruthenium-containing diffusion-barrier/seed layer 140 and lower portions 162 of copper layer 160 form conductive wiring structures 172, which are thereby insulated from each other. In other embodiments not shown, empty spaces 108 are lined with a diffusion barrier or adhesion layer, such as TiN, before formation of ruthenium-containing layer 130. An advantage of method in accordance with the invention, however, is that annealed ruthenium-containing layer 140 serves both as a seed layer and a diffusion barrier, thereby eliminating processes for forming a separate non-ruthenium-containing diffusion barrier or adhesion layer, such as TiN.

The word "substrate" herein can mean an entire workpiece, an underlying insulative material on which wiring is formed, as well as any object on which some material is deposited. In this disclosure, the terms "substrate", "substrate surface" and related terms generally mean the surface of the workpiece as it exists at a particular phase of fabrication and on which a particular fabrication process is being conducted.

The long dimensions of workpiece 102, 302, 402 and of insulative layers 106, 306, 406 in FIGS. 1-5, 7, 8 define planes that are considered to be a "horizontal" plane herein, and directions perpendicular to these planes are considered to be "vertical". Terms of orientation herein, such as "above", "top", "upper", "below", "bottom" and "lower", mean relative to layers 106, 306, 406. That is, if a second element is "above" a first element, it means it is farther from layer 106, 306, 406; and if it is "below" another element, then it is closer to the layer 106, 306, 406 than the other element. Similarly, dimensional terms, such as "high" and "higher", have their usual meanings with reference to the horizontal plane defined by the long dimensions of layers 106, 306, 406 in FIGS. 1-5, 7, 8. Terms such as "above" and "below" do not, by themselves, signify direct contact. However, terms such as "directly on" or "directly onto" do signify direct contact of at least a portion of one layer with at least a portion of an underlying or adjacent layer. As depicted in FIGS. 1-5, metal interconnects 172 are formed in accordance with the invention directly on substrate surface 107, 111. It is understood that embodiments in accordance with the invention are suitable for fabricating a plurality of wires or other metal-containing films in single-level or multilevel electronic devices.

Figure 6:
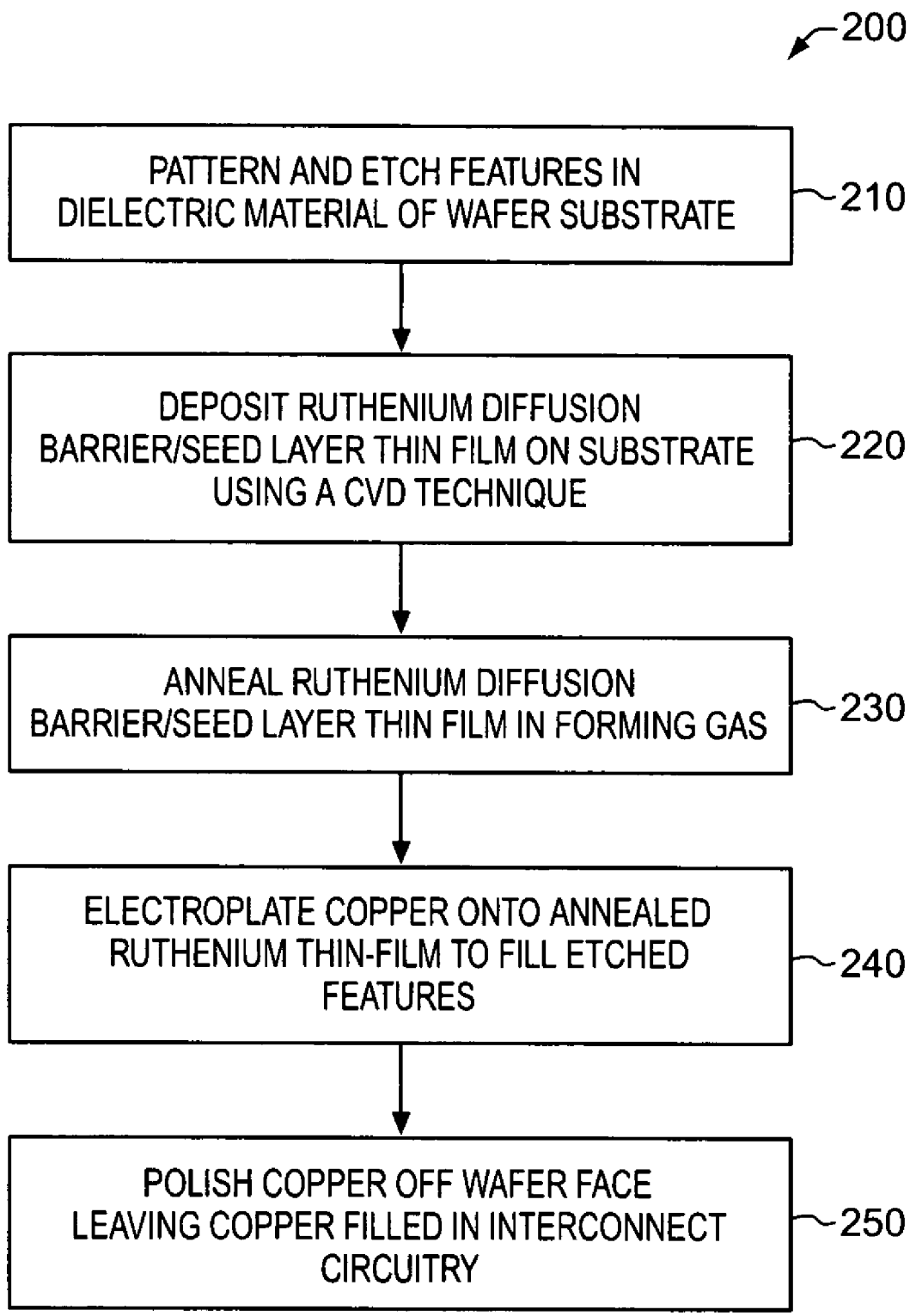
FIG. 6 contains a process flow diagram of a generalized method for depositing copper on a ruthenium diffusion-barrier/seed layer that has been treated in accordance with the invention.

FIG. 6 contains a process flow diagram 200 of a generalized method for depositing copper on a ruthenium seed layer and diffusion barrier that has been treated in accordance with the invention. Although process flow 200 is described with reference to FIGS. 1-5, it is clear that embodiments in accordance with the invention are useful for treating a ruthenium-containing thin film and depositing metal on substrate surfaces having various compositions and topographies and using various configurations of apparati. For example, although the invention is described herein mainly with reference to the electroplating of thin copper films in integrated circuits, methods and apparati in accordance with the invention are also useful for any process involving the plating of metal onto a ruthenium-containing thin film, including electrolytic and electroless plating of metal during integrated circuit fabrication. Thus, deposition of a metal onto a ruthenium-containing thin-film annealed in accordance with the invention includes electroplating and electroless plating of one or more metals selected from the group including copper, silver, gold and similar metals. Embodiments in accordance with the invention are also useful for depositing and annealing a ruthenium-containing seed layer comprising ruthenium and one or more other metals selected from the group including cobalt, nickel, and tantalum. It is important that material included in the ruthenium-containing seed layer not be prone to agglomeration under annealing conditions and that its diffusion-barrier properties persist after annealing.

Processes 210 include patterning and etching features in dielectric material 106 of wafer substrate 102 to form feature spaces 108, 109, as depicted in FIG. 1. Processes 210 typically are conducted using conventional techniques to form trenches, vias, and other feature spaces.

In processes 220, a ruthenium-containing diffusion barrier/seed layer thin film 130 is deposited on exposed surfaces 107 of dielectric layer 106 and other exposed surfaces, such as surfaces 111 of circuit elements 110, as depicted in FIG. 2. Preferably, a CVD or an ALD method is used to deposit the ruthenium-containing thin film. In some embodiments, PVD is used to deposit ruthenium-containing thin film 130. Ruthenium-containing thin film 130 typically has a thickness in a range of about from 1 nm to 20 nm. In some embodiments, exposed surfaces 107, 111 of substrate 102 are plasma-treated prior to depositing a ruthenium-containing thin film. Co-owned and co-pending U.S. patent application Ser. No.

10/821,751, which is incorporated by reference, teaches a plasma treatment of an integrated circuit substrate that improves ruthenium deposition by CVD or ALD, particularly onto dielectric material.

In processes 230, ruthenium thin-film 130 is annealed in accordance with the invention, as depicted in FIG. 3. Annealing is typically conducted using apparati and techniques known in the art for performing a forming gas anneal (FGA). Annealing is usually conducted in a conventional annealing oven in an oxygen-free environment. The oxygen-free environment in an annealing oven is typically achieved by flowing nitrogen gas through the oven. Annealing of ruthenium thin film 130 is typically conducted at a temperature in a range of about from 100° C. to 500° C. for a total time period in a range of about from 10 seconds to 1000 seconds, preferably in a range of about from 60 seconds to 200 seconds. In some embodiments, temperature is varied during the annealing processes. Annealing is typically conducted continuously for the total time period. In some embodiments, annealing is conducted in processes that include interruptions. Also, rapid thermal anneal techniques known in the art are useful in processes 230.

In some embodiments, treating of a ruthenium thin film in accordance with the invention also includes subjecting the ruthenium thin-film to ultraviolet (UV) radiation in addition to annealing. The UV radiation typically has a wavelength in a range of about from 180 nm to 280 nm, preferably about 254 nm. Treating with UV radiation typically is conducted in a separate chamber before or after annealing processes 230. In some embodiments, UV treatment is conducted in a conventional CVD deposition chamber during or after ruthenium deposition processes 220. In some embodiments, UV radiation is applied to the ruthenium thin-film in an annealing oven during annealing processes 230. UV radiation serves to decompose and to remove contamination from ruthenium thin-film 130, 140. Contamination includes carbon-containing material that may be present on the surface of the ruthenium surface following CVD deposition. Carbon contamination typically occurs in load and unload chambers, or arises from exposure to the ambient processing environment.

In processes 240, copper or another metal or a combination of metals is deposited onto annealed ruthenium thin-film 140, as depicted in FIG. 4. Typically a copper-containing layer or other metal layer deposited on an annealed ruthenium-containing layer in accordance with the invention has a thickness in a range of about from 150 nm to 1000 nm. Typically, metal deposition is conducted using conventional electroplating techniques. Co-owned and co-pending U.S. patent application Ser. No. 10/915,865, filed Aug. 11, 2004, which is hereby incorporated by reference, teaches methods and apparati for multistep immersion of a wafer into a plating bath to minimize bubble formation and bubble attachment to a wafer surface arising from wafer immersion, while also providing sufficient shear force to achieve good wetting of features and good wafer-liquid mass transfer. In some embodiments, electroplating is conducted in an electroplating solution that provides improved wetting of the substrate surface. Co-owned and co-pending U.S. patent application Ser. No. 10/879,613, filed Jun. 29, 2004, which is hereby incorporated by reference, teaches an electroplating solution that contains a wetting agent in addition to a suppressor and an accelerator. Such plating solution improves wetting of a wafer substrate surface, thereby reducing pit defects in electroplated metal. Compared with conventional electroplating solutions, the combination of a wetting agent with a suppressor functions to achieve improved deposit appearance, desired levels of current suppression on a wafer surface, a reduction of plating-bath contact angle on a substrate surface, a reduction of solid-liquid surface tension, and a reduction in the formation of micelles or polymer agglomerates. Alternatively, processes 240 include electroless deposition of metal onto annealed ruthenium thin film 140.

In processes 250, as depicted in FIG. 5, upper portion 164 of copper-containing metal layer 160 and upper portion 144 of diffusion-barrier/seed layer 130 are removed from the wafer face, typically by a conventional chemical metal polishing (CMP) technique. Remaining portions 142 of annealed ruthenium-containing diffusion-barrier/seed layer 140 and lower portions 162 of copper layer 160 in feature spaces 108, 109 are thereby insulated from each other and form conductive wiring structures 172.

After annealing of a ruthenium-containing thin film in processes 230, it is important to limit the exposure of the annealed ruthenium film to oxygen in order to prevent or to minimize re-oxidation of the ruthenium or other metal. In some embodiments, after processes 220, wafer substrates having un-annealed ruthenium seed layers are stored in wafer pods, transported to an annealing oven, and then moved by conventional techniques into the annealing oven. In some embodiments, after annealing processes 230, wafers having annealed ruthenium seed layers are stored in an oxygen-free environment for a period of time (e.g., several hours or days), and then moved to a plating cell for copper deposition onto the annealed seed layer. In other embodiments, after annealing processes 230, wafers having annealed ruthenium seed layers are transported in an oxygen-free environment directly to a plating cell. In other embodiments, after annealing processes 230, wafers having annealed ruthenium seed layers are transported in an oxygen-containing environment, typically air, but the exposure time to oxygen is limited. Preferably, the exposure time to air or other oxidizing conditions of an annealed ruthenium thin-film does not exceed one hour, more preferably it does not exceed five minutes. Plating cells typically operate in an air environment. An exemplary annealing and plating system is a Novellus model Sabre xT plating tool. The Sabre xT plating tool comprises five in-line anneal chambers, three electroplating cells, and three rinse stations. Such plating tool allows in-line robotic transport of an annealed wafer substrate after processes 230 into a plating cell, thereby minimizing exposure to air of an annealed ruthenium seed layer before immersion into a metal plating bath in deposition processes 240 to less than about one minute.

EXAMPLE 1

Adhesion tape tests were conducted to test the effect of ruthenium annealing in accordance with the invention on the adhesion between a ruthenium seed layer and copper that was electroplated onto the ruthenium seed layer.

Solid PDMAT (Pentakis dimethyl amidotantalum) was vaporized at 60° C. and about 0.5 Torr pressure into argon carrier gas flowing at 25 sccm. The PDMAT/argon gas stream was used to pretreat a series of 200 mm silicon semiconductor wafers having a substrate surface comprising PECVD silicon dioxide, $SiO_2$. After PDMAT-pretreatment, a MOCVD technique was used to deposit a thin film of ruthenium metal, Ru, on each of several treated wafers. Each wafer was placed on a heated substrate holder in a CVD reaction chamber. The pressure of the chamber was maintained at about 7 Torr. The wafer was heated to a temperature of about 300° C. Solid dicyclopentadienyl ruthenium ($RuCp_2$) was vaporized in a conventional gasification chamber at 120° C. into argon carrier gas. Argon carrier gas flowed at a flow rate of approximately 100 sccm through the gasification chamber. The vaporized ruthenium precursor and carrier gas flowed through a delivery line heated to 150° C. into the CVD reaction chamber. Oxygen gas, $O_2$, flowed into the chamber at a flow rate of 50 sccm. The flow rate of diluent nitrogen gas, $N_2$, into the chamber was 100 sccm. Pressure of the reaction chamber was maintained at about 7 Torr. Each wafer was exposed to identical MOCVD conditions to form a ruthenium thin film having a thickness of about 7.0 nm.

After storage in air exceeding seven days, several of the wafers containing a ruthenium thin film were treated by annealing in oxygen-free $N_2$-gas (forming gas) in accordance with the invention in an in-line anneal chamber of a Novellus model Sabre xT electroplating tool. Accordingly, the ruthenium thin film on one of the wafers was annealed at 150° C. for 90 seconds. The ruthenium thin film on another wafer was annealed at 250° C. for 90 seconds. The ruthenium thin film on a third wafer was annealed at 400° C. for 90 seconds. For comparison, other wafers received either no treatment or an acid treatment not in accordance with the invention. The acid treatment comprised exposing the ruthenium thin film to 50% sulfuric acid for 30 seconds.

After annealing in forming gas, each wafer was transferred from the anneal chamber to an electroplating cell. Transfer from the anneal chamber to the electroplating cell was completed within about one minute with exposure to air. In the electroplating cell, copper was electroplated directly onto each of the treated and untreated ruthenium thin films to form a copper layer having a thickness of approximately 130 nm. The electroplating solution used in the plating cell contained: 40 g/l of dissolved copper metal, added as copper sulfate pentahydrate ($CuSO_4.5H_2O$); 10 g/l $H_2SO_4$; 50 ppm chloride ion, added as HCl; 6 ml/l Viaform accelerator; 2.5 ml/l Viaform leveler; and 2 ml/l Viaform suppressor. The Viaform accelerator, suppressor, and leveler are commercially available from Enthone Company. Copper plating was conducted at 25° C. The plating solution was pumped into the plating chamber at a volumetric flow rate of about 12 liters per minute. The distance between the cathodic plating surface of the wafer and the top surface of the anode was about 10 mm. After immersion of a substrate wafer into the plating solution, the wafer cathode was rotated at 125 rpm and negatively biased during a first plating time of 5.5 seconds to generate a DC current density of approximately 6.67 mA/cm$^2$ at the deposition surface of the 200 mm wafer. During a second plating time of 30 seconds, the wafer was rotated at 18 rpm and a negative bias was applied to generate a DC current density of 10 mA/cm$^2$ at the deposition surface of the wafer. The resulting layer deposited on each wafer had a thickness of approximately 130 nm.

Then, adhesion tests were conducted on each of the wafers. Both the cellophane-tape-test technique without scribing and the cellophane-tape-test technique with scribing, which techniques are known in the art, were performed on each wafer. The cellophane-tape-test without scribing was conducted by adhering a piece of cellophane tape across a wafer through its center, then removing the tape and observing whether deposited wafer material was peeled away with the removed tape, and if so, then determining the location of the adhesion failure. The cellophane-tape-test with scribing was conducted by first scribing (i.e., scratching) with a diamond tipped scribe one or more linear cuts into the substrate surface down to the dielectric material before adhering cellophane tape across the wafer perpendicular to the one or more linear cuts. In this example, three parallel linear cuts about 3 cm long separated by approximately 1 cm were made through the deposited metal down to the dielectric $SiO_2$. A cellophane-tape test with scribing is more rigorous than a test without scribing because the surfaces in the scribed cuts through the deposited layers provide better overall tape adhesion and also provide contact interfaces of the tape with exposed lateral edges of each of the deposited layers. The location of adhesion failure of the deposited films on each wafer was observed in each of the tests. The results are tabulated in Table 1.

TABLE 1

| Wafer ID | Treatment of Ru thin film | Tape test w/o scribing | | Peel area of tape test after scribing | |
|---|---|---|---|---|---|
| | | Center | Edge | Center | Edge |
| 3 | No treatment | Pass | Pass | Cu/Ru | Ru/SiO$_2$ |
| 4 | No treatment | Pass | Pass | Cu/Ru | Ru/SiO$_2$ |
| 5 | Acid treatment | Pass | Pass | Cu/Ru | Cu/Ru |
| 6 | Anneal 150° C., 90 sec | Pass | Pass | Ru/SiO$_2$ | Ru/SiO$_2$ |
| 7 | Anneal 250° C., 90 sec | Pass | Pass | Ru/SiO$_2$ | Ru/SiO$_2$ |
| 8 | Anneal 400° C., 90 sec | Pass | Pass | Ru/SiO$_2$ | Ru/SiO$_2$ |

The results show that all wafers passed the tape test without scribing. In contrast, an adhesion failure occurred at one or more layer interfaces on all wafers in the tape test with scribing. The location of the adhesion failure, however, generally depended on whether the ruthenium thin film had been annealed in accordance with the invention prior to electroplating of the Cu layer on each wafer. On the two wafers with ID numbers 3 and 4 that received no treatment, the peel area of tape indicating test failure occurred at the Cu/Ru interface at the center of the wafer, while test failure occurred at the Ru/SiO$_2$ interface at the edge of the wafer. On the wafer with ID number 5 that received acid treatment, the peel area of tape indicating test failure occurred at the Cu/Ru interface at both the center of the wafer and at the edge of the wafer. In contrast, on all wafers on which the ruthenium thin film was annealed in accordance with the invention, the adhesion failure of deposited layers that occurred upon removing the cellophane tape occurred at the Ru/SiO$_2$ interface. These results indicate that annealing of the ruthenium thin film in accordance with the invention prior to electroplating copper improved the adhesion of the electroplated copper to the underlying ruthenium thin film.

EXAMPLE 2

The resistivity of ruthenium thin films before and after annealing of the thin films in accordance with the invention was measured.

Two 200 mm silicon semiconductor wafers having a substrate surface comprising PECVD silicon dioxide, $SiO_2$, were pretreated as in Example 1. A ruthenium thin film was formed on each of the two 200 mm silicon semiconductor wafers using processes as described in Example 1. On one wafer, the resulting ruthenium thin-film had a thickness of approximately 4.0 nm. On the second wafer, the resulting ruthenium thin-film had a thickness of approximately 7.0 nm.

After storage in air exceeding seven days, the resistivity of each of the un-annealed ruthenium thin films was measured. Thereafter, each of the wafers containing a ruthenium thin film was treated by annealing in oxygen-free $N_2$-gas (forming gas) in accordance with the invention at 400° C. for 90 seconds. Then, the resistivity of each of the annealed ruthenium thin films was measured. The results are tabulated in Table 2.

TABLE 2

| Ru film thickness | Resistivity b/f anneal ($\mu\Omega$ cm) | Resistivity after anneal ($\mu\Omega$ cm) |
|---|---|---|
| 4.0 nm | 15.05 | 11.2 |
| 7.0 nm | 15.66 | 12.8 |

The results show that annealing of ruthenium thin films resulted in a significant decrease in the resistivity of the ruthenium thin films.

EXAMPLE 3

Figure 7:
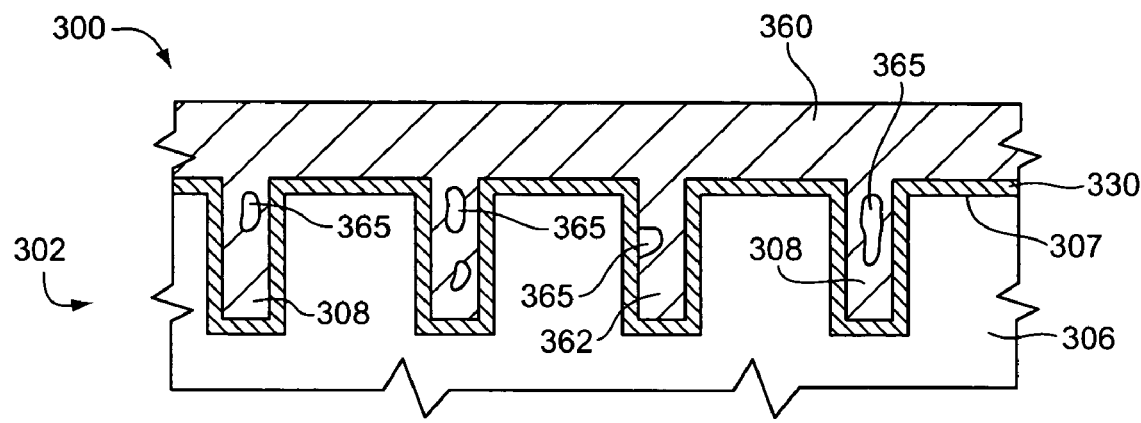
FIG. 7 depicts schematically a semiconductor wafer processed as in the prior art on which copper was electroplated on an un-annealed ruthenium seed layer, resulting in formation of undesirable void spaces in the copper-filled features.
Figure 8:
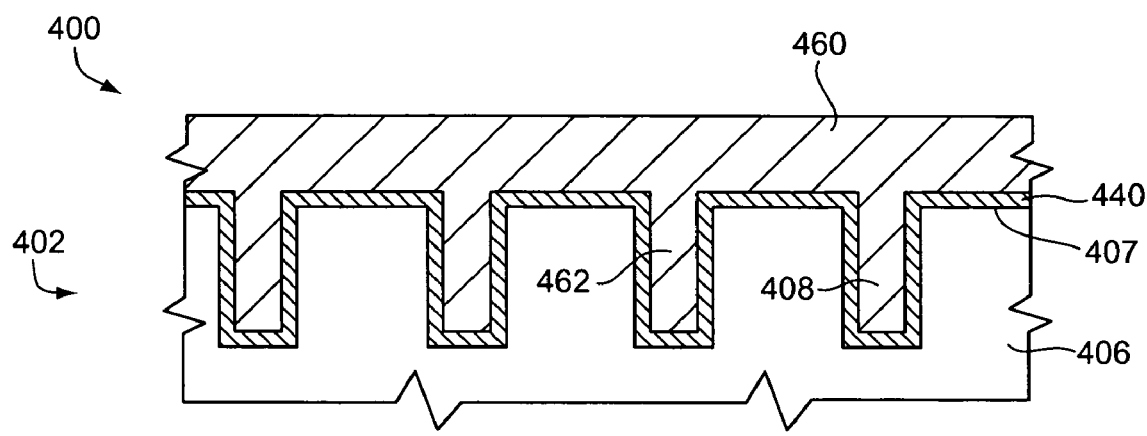
FIG. 8 depicts schematically a semiconductor wafer processed in accordance with the invention on which copper was electroplated onto an annealed ruthenium seed layer, resulting in satisfactory electrofilling of copper in high-aspect-ratio vias without the formation of undesirable void spaces.

Two 200 mm silicon semiconductor wafers having a substrate surface comprising PECVD silicon dioxide, $SiO_2$ were pretreated as in Example 1. FIGS. 7 and 8 depict schematically sections 300, 400 of semiconductor wafers 302, 402, respectively. As depicted in FIGS. 7 and 8, the wafers 302, 402 were patterned and etched using conventional techniques to form features in the $SiO_2$ dielectric layer 306, 406. The etching processes formed exposed field surface 307, 407 of dielectric layer 306, 406. The etched features 308, 408 had shapes corresponding to circular vias having a diameter of 200 nm and a depth of 1100 nm. A ruthenium thin film was formed on each of the two 200 mm silicon semiconductor wafers using MOCVD processes as described in Example 1. Each of the resulting ruthenium thin films had a thickness of approximately 14 nm.

FIG. 7 depicts schematically ruthenium thin film 330 deposited on field surface 307 and on the inner surfaces of vias 308. Ruthenium thin film 330 was not annealed in accordance with the invention. After storage of wafer 302 in air exceeding seven days, copper layer 360 having a thickness of approximately 130 nm was electroplated onto un-annealed ruthenium thin film 330 using processes described in Example 1. As depicted in FIG. 7, electroplating of copper onto un-annealed ruthenium thin film 330, as in the prior art, resulted in unsatisfactory electrofilling of copper 362 in vias 308 and in the formation of undesirable void spaces 365 in vias 308.

After storage of wafer 402 in air exceeding seven days, the ruthenium thin film deposited on wafer 402 was annealed in accordance with the invention in oxygen-free $N_2$ forming gas in an in-line anneal chamber of a Novellus model Sabre xT electroplating tool at 250° C. for 90 seconds. FIG. 8 depicts schematically annealed ruthenium thin film 440 located on field surface 407 and on the inner surfaces of vias 408. After annealing in forming gas, wafer 402 was transferred from the anneal chamber to an electroplating cell. Transfer from the anneal chamber to the electroplating cell was completed within about one minute with exposure to air. In the electroplating cell, copper was electroplated using processes as described in Example 1 directly onto annealed ruthenium thin film 440 to form copper layer 460 having a thickness of approximately 130 nm.

As depicted in FIG. 8, electroplating of copper onto annealed ruthenium thin film 440, in accordance with the invention, resulted in satisfactory electrofilling of copper 462 in vias 408 without the formation of undesirable void spaces.

The particular systems, designs, methods and compositions described herein are intended to illustrate the functionality and versatility of the invention, but should not be construed to be limited to those particular embodiments. Methods in accordance with the invention are useful in a wide variety of circumstances and applications to treat a ruthenium-containing thin film prior to plating metal onto the ruthenium-containing thin-film. It is evident that those skilled in the art may now make numerous uses and modifications of the specific embodiments described, without departing from the inventive concepts. It is also evident that the steps recited may, in some instances, be performed in a different order; or equivalent structures and processes may be substituted for the structures and processes described. Since certain changes may be made in the above systems and methods without departing from the scope of the invention, it is intended that all subject matter contained in the above description or shown in the accompanying drawings be interpreted as illustrative and not in a limiting sense. Consequently, the invention is to be construed as embracing each and every novel feature and novel combination of features present in or inherently possessed by the systems, methods and compositions described in the claims below and by their equivalents.

The invention claimed is:

1. A method of treating a ruthenium-containing thin film during integrated circuit fabrication, comprising processes of:
   providing a ruthenium-containing thin film located on a substrate, said ruthenium-containing thin film having a thickness in a range of about from 1 nm to 20 nm; and
   annealing said ruthenium-containing thin film in an oxygen-free environment under oxide-reducing conditions to form a substantially oxide-free annealed ruthenium-containing thin film.

2. A method as in claim 1, wherein said processes of annealing are conducted before depositing metal on said annealed ruthenium-containing thin film.

3. A method as in claim 1, further comprising processes of applying UV radiation to said annealed ruthenium-containing thin film before depositing metal on said annealed ruthenium-containing thin film.

4. A method as in claim 1, further comprising processes of applying UV radiation to said ruthenium-containing thin film before said processes of annealing.

5. A method as in claim 1, further comprising processes of applying UV radiation to said ruthenium-containing thin film during said processes of annealing.

6. A method as in claim 1, wherein said ruthenium-containing thin film comprises substantially ruthenium atoms.

7. A method as in claim 1, wherein said ruthenium-containing thin film has a thickness in a range of about from 1 nm to 10 nm.

8. A method as in claim 1, wherein said processes of annealing said ruthenium-containing thin film comprise annealing said ruthenium-containing thin film in an oxygen-free environment at a temperature in a range of about from 100° C. to 500° C. for a total time period in a range of about from 10 seconds to 1000 seconds.

9. A method as in claim 1, wherein said processes of annealing are conducted in forming gas.

10. A method as in claim 1, further comprising processes of moving said ruthenium-containing thin film on said substrate into an anneal chamber before said processes of annealing.

11. A method as in claim 10, further comprising processes of removing gas from said anneal chamber before said processes of annealing to form said oxygen-free environment.

12. A method as in claim 11, wherein said processes of removing gas from said anneal chamber comprise flowing an oxygen-free gas through said anneal chamber.

13. A method as in claim 12, wherein said flowing an oxygen-free gas comprises flowing nitrogen gas.

14. A method of forming a ruthenium-containing thin film, comprising processes of:

depositing a ruthenium-containing thin film to a thickness in a range of about 1 nm to 20 nm on a substrate; and annealing said ruthenium-containing thin film in an oxygen-free environment under oxide-reducing conditions to form a substantially oxide-free annealed ruthenium-containing thin film.

15. A method as in claim 14, wherein said processes of depositing a ruthenium-containing thin film comprise depositing substantially ruthenium atoms.

16. A method as in claim 14, wherein said processes of depositing a ruthenium-containing thin film comprise depositing a ruthenium-containing thin-film having a thickness in a range of about from 1 nm to 10 nm.

17. A method as in claim 14, wherein said processes of annealing said ruthenium-containing thin film comprise annealing said ruthenium-containing thin film in an oxygen-free environment at a temperature in a range of about from 100° C. to 500° C. for a total time period in a range of about from 10 seconds to 1000 seconds.

18. A method as in claim 14, wherein said processes of depositing a ruthenium-containing thin film on a substrate comprise depositing said ruthenium-containing thin film on dielectric material.

19. A method as in claim 14, wherein said processes of depositing a ruthenium-containing thin film on a substrate comprise depositing said ruthenium-containing thin film on metal nitride material.

20. A method of plating metal in an integrated circuit, comprising processes of:

providing a ruthenium-containing thin film on a substrate;

annealing said ruthenium-containing thin film in an oxygen-free environment under oxide-reducing conditions to form a substantially oxide-free annealed ruthenium-containing thin film; and plating metal directly onto said annealed ruthenium-containing thin film.

21. A method as in claim 20, further comprising processes of applying UV radiation to said annealed ruthenium-containing thin film before plating metal on said annealed ruthenium-containing thin film.

22. A method as in claim 20, wherein said ruthenium-containing thin film comprises substantially ruthenium atoms.

23. A method as in claim 20, wherein said ruthenium-containing thin film has a thickness in a range of about from 1 nm to 50 nm.

24. A method as in claim 23, wherein said ruthenium-containing thin film has a thickness in a range of about from 1 nm to 20 nm.

25. A method as in claim 24 wherein said ruthenium-containing thin film has a thickness in a range of about from 1 nm to 10 nm.

26. A method as in claim 20, wherein said processes of annealing said ruthenium-containing thin film comprise annealing said ruthenium-containing thin film in an oxygen-free environment at a temperature in a range of about from 100° C. to 500° C. for a total time period in a range of about from 10 seconds to 1000 seconds.

27. A method as in claim 26 wherein said processes of annealing said ruthenium-containing thin film comprise annealing said ruthenium-containing thin film in an oxygen-free environment at a temperature not exceeding 400° C.

28. A method as in claim 26 wherein said processes of annealing said ruthenium-containing thin film comprise annealing said ruthenium-containing thin film in an oxygen-free environment at a temperature not exceeding 250° C.

29. A method as in claim 26 wherein said processes of annealing said ruthenium-containing thin film comprise annealing said ruthenium-containing thin film in an oxygen-free environment at a temperature not exceeding 150° C.

30. A method as in claim 26 wherein said processes of annealing said ruthenium-containing thin film comprise annealing said ruthenium-containing thin film in an oxygen-free environment for a total time period not exceeding 100 seconds.

31. A method as in claim 20, wherein said processes of annealing are conducted less than 24 hours before said processes of plating metal.

32. A method as in claim 31, wherein said processes of annealing are conducted less than 3 hours before said processes of plating metal.

33. A method as in claim 32, wherein said processes of annealing are conducted less than 1 hour before said processes of plating metal.

34. A method as in claim 33, wherein said processes of annealing are conducted less than five minutes before said processes of plating metal.

35. A method as in claim 20, wherein said processes of plating metal comprise electroplating metal.

36. A method as in claim 20, wherein said processes of plating metal comprise electroless plating of metal.

37. A method as in claim 20, further comprising processes of storing said annealed ruthenium-containing thin film in an oxygen-free space before said processes of plating metal.

38. A method as in claim 20, further comprising processes of limiting exposure to oxidizing conditions of said annealed ruthenium-containing thin film before said plating processes to less than three hours.

39. A method as in claim 38, wherein said processes of limiting exposure to oxidizing conditions before said plating processes limits exposure to less than one hour.

40. A method as in claim 39, wherein said processes of limiting exposure to oxidizing conditions before said plating processes limits exposure to less than five minutes.

41. A method as in claim 20, wherein said processes of plating metal comprise plating copper.

42. A method as in claim 20, wherein said processes of plating metal comprise plating a metal selected from the group consisting of copper, cobalt, nickel, and tantalum.

43. A method as in claim 20, wherein said processes of providing a ruthenium-containing thin film on a substrate comprise providing said ruthenium-containing thin film on a dielectric substrate.

* * * * *